United States Patent
Bhatnagar et al.

(10) Patent No.: US 7,732,056 B2
(45) Date of Patent: Jun. 8, 2010

(54) CORROSION-RESISTANT ALUMINUM COMPONENT HAVING MULTI-LAYER COATING

(75) Inventors: Ashish Bhatnagar, Fremont, CA (US); Laxman Murugesh, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/037,633

(22) Filed: Jan. 18, 2005

(65) Prior Publication Data

US 2006/0159940 A1 Jul. 20, 2006

(51) Int. Cl.
- B32B 15/04 (2006.01)
- C23C 14/08 (2006.01)
- C23C 14/34 (2006.01)
- C25D 11/16 (2006.01)
- C25D 11/18 (2006.01)

(52) U.S. Cl. ............... 428/472.2; 428/701; 204/192.15; 205/201; 205/208; 205/324

(58) Field of Classification Search ........................ None
See application file for complete search history.

(56) References Cited

U.S. PATENT DOCUMENTS

| | | | |
|---|---|---|---|
| 3,616,310 A | 10/1971 | Dorsey, Jr. | |
| 4,606,796 A | 8/1986 | Hanazima et al. | |
| 4,862,799 A | 9/1989 | Hycner et al. | |
| 5,104,514 A | 4/1992 | Quartarone | |
| 5,290,424 A | 3/1994 | Mozelewski et al. | |
| 5,314,601 A | 5/1994 | Hardee et al. | |
| 5,366,585 A * | 11/1994 | Robertson et al. | 216/67 |
| 5,401,573 A * | 3/1995 | Babel et al. | 428/336 |
| 5,756,222 A | 5/1998 | Bercaw et al. | |
| 5,804,253 A * | 9/1998 | Hagiwara et al. | 427/386 |
| 5,811,195 A * | 9/1998 | Bercaw et al. | 428/472 |
| 5,856,236 A | 1/1999 | Lai et al. | |
| 5,858,464 A | 1/1999 | Littau et al. | |
| 6,117,772 A | 9/2000 | Murzin et al. | |
| 6,159,618 A * | 12/2000 | Danroc et al. | 428/610 |
| 6,355,554 B1 | 3/2002 | Choi et al. | |
| 6,368,880 B2 | 4/2002 | Singhvi et al. | |
| 6,458,683 B1 | 10/2002 | Lee | |
| 6,458,684 B1 | 10/2002 | Guo et al. | |
| 6,471,879 B2 | 10/2002 | Hanson et al. | |
| 6,537,905 B1 | 3/2003 | Chen et al. | |
| 6,565,984 B1 | 5/2003 | Wu et al. | |
| 6,592,707 B2 | 7/2003 | Shih et al. | |

(Continued)

OTHER PUBLICATIONS

Derwent abstract for SU 1797027, pub. Feb. 23, 1993.*

(Continued)

*Primary Examiner*—John J Zimmerman
(74) *Attorney, Agent, or Firm*—Patterson & Sheridan, LLP; Ashok Janah

(57) ABSTRACT

A method of providing a corrosion-resistant coating on a surface of an aluminum component comprises anodizing the surface of the aluminum component to form an anodized aluminum oxide layer and sputter coating a sputtered layer on the anodized aluminum oxide layer. A coated aluminum component can be used in a substrate processing chamber and comprises an aluminum body, an anodized aluminum oxide layer formed on the aluminum body, and a sputtered layer comprising aluminum oxide on the anodized aluminum oxide layer.

24 Claims, 5 Drawing Sheets

U.S. PATENT DOCUMENTS

| | | | |
|---|---|---|---|
| 6,649,031 B1 | 11/2003 | Iqbal et al. | |
| 6,649,039 B2 | 11/2003 | Hsu et al. | |
| 6,659,331 B2 | 12/2003 | Thach et al. | |
| 6,672,917 B2 | 1/2004 | Matsuda et al. | |
| 6,713,188 B2 | 3/2004 | Wu et al. | |
| 6,776,873 B1* | 8/2004 | Sun et al. | 156/345.41 |
| 2002/0012022 A1* | 1/2002 | Fassler et al. | 347/28 |
| 2002/0148941 A1* | 10/2002 | Sorokov et al. | 249/114.1 |
| 2003/0047464 A1* | 3/2003 | Sun et al. | 205/646 |
| 2003/0150530 A1* | 8/2003 | Lin et al. | 148/518 |
| 2003/0205479 A1 | 11/2003 | Lin et al. | |
| 2004/0129574 A1* | 7/2004 | Kia et al. | 205/213 |
| 2005/0037193 A1* | 2/2005 | Sun et al. | 428/332 |

OTHER PUBLICATIONS

Lowenheim, Frederick, Modern Electroplating, Chapter 30 "Anodizing", pp. 632-641.*

Lowenheim, Frederick, Modern Electroplating, Chapter 30 "Anodizing", pp. 632-641, copyright 1942.*

* cited by examiner

CORROSION-RESISTANT ALUMINUM COMPONENT HAVING MULTI-LAYER COATING

BACKGROUND

The present invention relates to aluminum components for a substrate processing chamber and their methods of manufacture.

In the processing of a substrate in a substrate processing chamber, as in the manufacture of integrated circuits and displays, the substrate is typically exposed to energized gases that are capable of, for example, etching or depositing material on the substrate. The energized gases can also be provided to clean surfaces of the chamber. However, the energized gases can often comprise corrosive halogen-containing gases and other energized species that can corrode components of the chamber, such as enclosure walls of the chamber. For example, chamber components made of aluminum can chemically react with energized halogen-containing gases to form $AlCl_3$ or $AlF_3$, thereby corroding the components. The corroded portions of the components can flake off and contaminate the substrate, which reduces the substrate yield. Thus, the corroded components must often be replaced or removed from the chamber and cleaned, resulting in undesirable chamber downtime.

The corrosion resistance of a chamber component can be improved by forming a coating of a corrosion resistant material over surfaces of the component that are susceptible to corrosion, such as surfaces that would otherwise be exposed to the energized gas. For example, a coating of aluminum oxide can be formed on surfaces of an aluminum component by anodizing the aluminum component in an electrolytic cell. However, anodized aluminum oxide coatings often contain surface features such as pores, cracks, indentures, and other penetrating features that limit the ability of the anodized aluminum coating to protect the underlying aluminum component. For example, surface features that extend through the protective coating can allow corrosive gases to penetrate the coating and erode the underlying component material thereby causing the coating to flake off of the component. This can cause the coating itself to contaminate the chamber and the substrate being processed therein.

The performance of the anodized aluminum oxide layer can be improved by coating the anodized layer with a protective material, such as a fusible polymer or an organic fluid, to protect the aluminum article from surface scars and dents. This process, however, requires additional process steps to cure, dry or seal the protective layer. Such additional steps also augment the cost and time to manufacture the article.

It is also desirable to reduce or prevent the diffusion of impurities that are present in the underlying aluminum structure to the exposed surface of the component. Aluminum alloys, for example, 6061 aluminum alloy often contains trace elements of impurities such as chromium, iron, or manganese; and sometimes even calcium, potassium or magnesium. When the raw surface of the aluminum component is exposed to the plasma environment in the process chamber, the low vacuum pressure in the chamber as well as the elevated temperatures of the plasma can cause migration of the impurities to the exposed surface of the aluminum component. The resultant higher surface concentration of impurity is undesirable and can result in contamination of the substrate.

Another way to protect a chamber component is to utilize a high purity aluminum-magnesium alloy to form the chamber component itself. The surface of the component is anodized and then exposed to a halogen-containing species. The halogens diffuse through the aluminum oxide layer to form a protective magnesium halide layer immediately beneath the aluminum oxide layer. The magnesium halide layer renders the article's surface corrosion-resistant and the aluminum oxide layer protects the underlying magnesium halide layer. While this approach provides good corrosion resistance, it can also be costly because the aluminum-magnesium alloy is difficult to fabricate.

Thus, there is a need for aluminum components that exhibit improved corrosion resistance to energized gases. There is also a need for aluminum components having an aluminum oxide coating that exhibits improved corrosion resistance and is less susceptible to the erosion and flaking off of aluminum particles. There is a further need for an aluminum component that has a low level of surface impurity concentration.

SUMMARY

A method of providing a corrosion-resistant coating on a surface of an aluminum component comprises anodizing the surface of the aluminum component to form an anodized aluminum oxide layer and sputter coating a layer on the anodized aluminum oxide layer. In one version, a portion of the method of coating the surface of the aluminum component can be used to coat an anodized surface of an aluminum component.

The coated aluminum component can be used in a substrate processing chamber and comprises an aluminum body, an anodized aluminum oxide layer formed on the aluminum body, and on the anodized aluminum oxide layer a sputtered layer comprising aluminum oxide.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
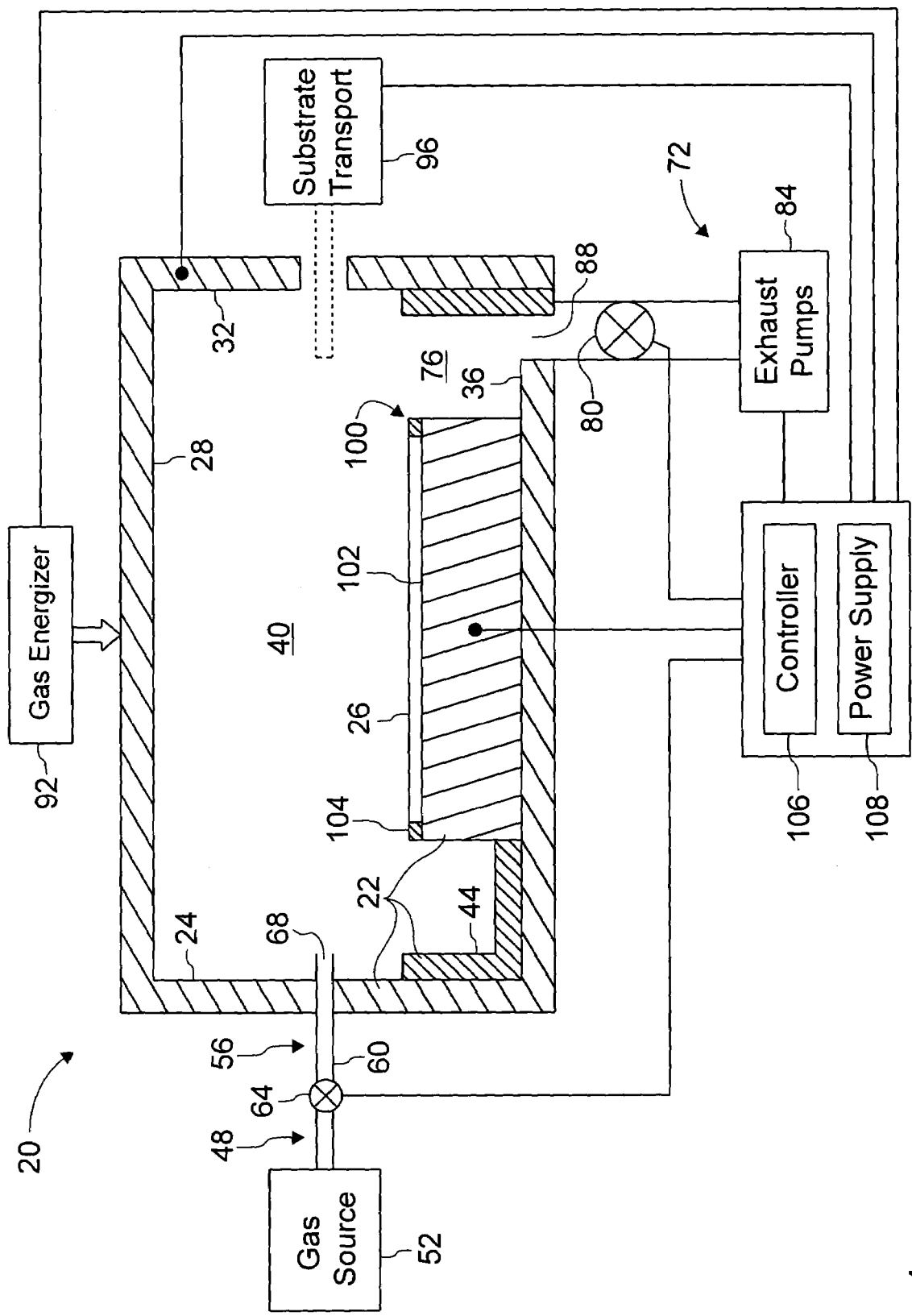
FIG. 1 is a partial sectional side view of a substrate processing chamber having an aluminum component with a coating according to the present invention.

An exemplary conventional processing chamber 20 used for semiconductor substrate fabrication processes, such as chemical vapor deposition or etching, is illustrated in FIG. 1. Generally, the processing chamber 20 comprises enclosure walls 24, including a ceiling 28, sidewalls 32, and a bottom wall 36 that enclose a process zone 40. The chamber 20 may also comprise a liner 44 that lines at least a portion of the enclosure wall 24 about the process zone 40. Process gas is introduced into the chamber 20 through a gas supply 48 that includes a process gas source 52 and a gas distributor 56. The gas distributor 56 may comprise one or more conduits 60 having one or more gas flow valves 64, and one or more gas inlets 68 around a periphery of a substrate support 100 having a substrate receiving surface 102 to receive a substrate 26. Alternatively, the gas distributor may comprise a showerhead gas distributor (not shown) that distributes the process gas to the process zone 40 from the ceiling 28. Spent process gas and etchant byproducts are exhausted from the chamber 20 through an exhaust 72 which may include a pumping channel 76 that receives spent process gas from the process zone 40, a throttle valve 80 to control the pressure of process gas in the chamber 20, and one or more exhaust pumps 84.

Chamber components 22, including for example at least a portion of one or more of the enclosure wall 24, liner 44, substrate support 100, gas supply 48, gas energizer 92, gas exhaust 72, and substrate transport 96, are typically exposed to corrosive halogen-containing species. Particularly corrosive are the gas mixtures typically used to plasma-clean the chamber components.

Certain chamber components 22 are fabricated from aluminum materials by shaping aluminum or an aluminum alloy into the shape required by the function of the component 22 in the processing chamber 20. For example, the aluminum component 22 can comprise a shape having planar portions, curved portions, ledges, flanges, holes, and other geometric arrangements. The component 22 can be formed by a number of processes, including forging, machining, molding, extruding, or a combination of these or other manufacturing processes. The aluminum or aluminum alloy of the component 22 is selected according to the manufacturing and functional requirements of the component 22. For example, the shape and size of the component 22 can determine the desired material properties of the aluminum or aluminum alloy.

In one version, the aluminum or aluminum alloy of the component 22 is an aluminum alloy referred to as LP™ aluminum alloy, which is an aluminum alloy described in U.S. Patent Application Publication 2003/0150530, to Lin et al., assigned to Applied Materials, Inc. of Santa Clara, Calif. LP™ is a trademark of Applied Materials Inc. LP™ aluminum alloy can be advantageous because it results in a higher quality anodized aluminum coating. In Lp™ aluminum alloy, the concentration of mobile and non-mobile impurities is controlled to be within specific ranges. In particular, such an alloy should have the following composition by weight % a magnesium concentration of from about 3.5% to about 4.0%, a silicon concentration of less than 0.03%, an iron concentration of less than 0.03%, a copper concentration of from about 0.02% to about 0.07%, a manganese concentration of from about 0.005% to about 0.015%, a zinc concentration of from about 0.08% to about 0.16%, a chromium concentration of from about 0.02% to about 0.07%, and a titanium concentration of less than 0.01%, with other single impurities not exceeding about 0.03% each and other total impurities not exceeding about 0.1%.

In addition, LP™ aluminum alloy is required to meet a particular specification with respect to particulates formed from mobile impurities. Of the particulate agglomerations of impurity compounds, at least 95% of all particles must be less than 5 µm in size. Five (5%) of the particles may range from 5 µm to 20 µm in size. Finally, no more than 0.1% of the particles may be larger than 20 µm, with no particles being larger than 40 µm.

In another version, the aluminum or aluminum alloy of the component 22 can be an aluminum-magnesium-silicon alloy, such as for example, 6061 aluminum alloy, which can be advantageous because it is a common and readily available material. In still other versions, the aluminum or aluminum alloy of the component 22 can be an aluminum-magnesium alloy, such as a 5000 series (5xxx) aluminum alloy (for example 5005, 5050, 5052, 5083, 5086, 5144, 5144, 5357, 5447, 5454, 5456, or 5457 aluminum alloy).

When exposed to the corrosive environment in the chamber 20, the aluminum components 22 are susceptible to reaction with halogens such as chlorine, fluorine, and bromine, to produce compounds that can flake off from or create voids in the surfaces of the component 22. This causes the component 22 to erode and also serves as a source of particulate contamination of the chamber 20.

Figure 2A:
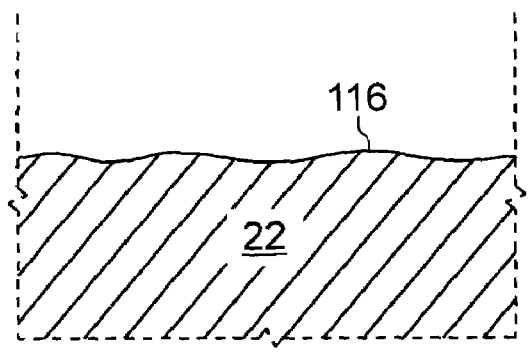
FIGS. 2A to 2C are sectional views of stages in the method to form the aluminum component having the coating.
Figure 2B:
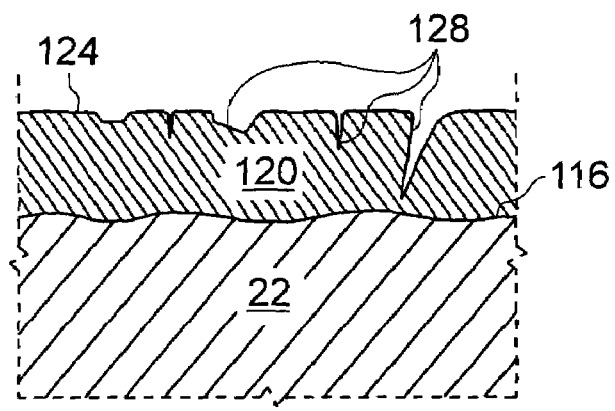
Figure 2C:
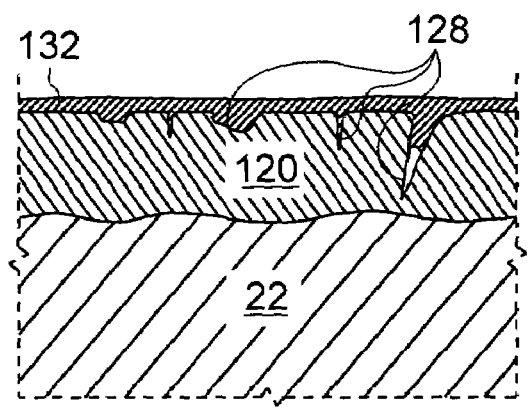
Figure 3:
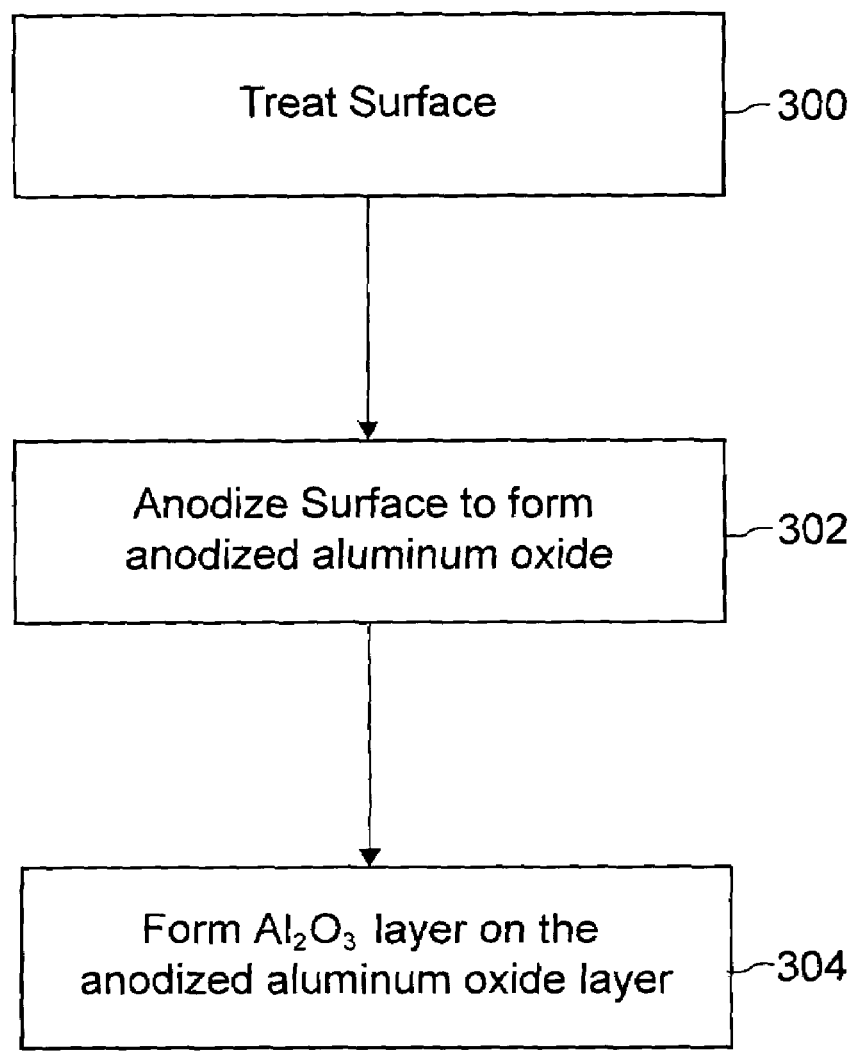
FIG. 3 is a schematic view of an anodizing apparatus suitable for conducting steps of the method to fabricate the aluminum component having the coating.

In one version, a component 22 is protected and contamination of the chamber 20 is minimized by forming a protective coating on the surface of the component 22. FIGS. 2A through 2C illustrate sectional side views of the aluminum component 22 during its fabrication and FIG. 3 is a flowchart illustrating the process of forming the protective coating on the aluminum component 22. Referring to FIGS. 2A-2C, and FIG. 3, the surface 116 of the component 22 that receives the protective coating may be treated to receive the protective coating (step 300). Treatment of the surface 116 prior to forming the coating may contribute to the speed and ease of fabrication and the quality of the final protective coating.

In one version, the treatment of the surface 116 of the component 22 includes roughening the surface 116 by performing a bead blasting process that propels bead particles at the surface 116. The bead blasting process forms a suitable surface roughness and other characteristics of the surface 116 of the aluminum component 22. For example, bead blasting may erode away excessively sharp edges and corners of features of the component surface 116, thereby producing a surface 116 that does not present potentially stress-inducing features to overlying layers. The bead blasting process can also texture portions of the component surface 116 to improve adhesion of materials to the surface 116. For example, deposited material may adhere better to a surface with a controlled texture in comparison to a completely smooth surface.

In the bead blasting process, a stream of hard bead particles is propelled toward the surface 116 of the component 22 by gas that is pressurized to a pressure sufficiently high to cause the bead particles to erode and remove material from the surface 116. For example, a suitable pressure may be from about 20 psi to about 110 psi. The bead particles desirably comprise a material having a hardness that is higher than that of the surface 116. For example, the grit particles can comprise aluminum oxide, garnet, silicon oxide, silicon carbide, glass, silica, hard plastic or mixtures thereof. The bead particle size can also be selected to influence the size of features created by the bead blasting process on the surface 116. For example, the bead particles can have a mesh size of from about 100 to about 200. The angle of incidence of the bead particles relative to the component surface 116 and the standoff distance traveled by the bead particles from their source to the component 22 can also be selected to provide the desired roughness of the surface 116. For example, the angle of incidence of the bead particles relative to the component surface 116 may be about 30° to about 60°, and the standoff distance may be from about 7 cm to about 32 cm. In one version, the surface 116 of the component 22 is roughened to have a roughness average of, for example, from about 100 microinches to about 200 microinches.

Treatment of the surface 116 of the component 22 may also include cleaning of the surface 116 to remove impurities and loose particles. The cleaning process can also remove chemicals or materials that may remain from the fabrication of the component 22, such as oils or coolant from a forging or machining process, or sand or other materials from a molding process. The cleaning process may also chemically polish the surface 116 of the component 22. For example, the cleaning process can remove an external layer of material from the component 22. This may remove undesirable oxides and other materials that may have formed on the surface of the component 22. In one version, the surface 116 of the component 22 is immersed in a solution comprising an acidic solution, an organic solvent, an alkaline solution, water, de-ionized water, or mixtures thereof. For example, the acidic solution may comprise oxalic acid, phosphoric acid, nitric acid, sulfuric acid or mixtures thereof. The organic solvent may comprise acetone, isopropyl alcohol, or mixtures thereof. The alkaline solution may comprise sodium hydroxide, potassium hydroxide, or mixtures thereof. Additionally, the surface may be immersed in several different solutions comprising different compositions and concentrations.

For example, in one version, the surface 116 of the component 22 may be cleaned by (i) immersing the surface 116 in a solution comprising an organic solvent, (ii) rinsing the surface 116 in water, (iii) immersing the surface 116 in a solution comprising an acid, and (iv) rinsing the surface 116 in de-ionized water. In step (iii), the solution may comprise, for example, about 5% to about 50% by weight sulfuric acid at a temperature of about 15° C. to about 90° C., and the surface 116 may be immersed for about 1 minute to about 30 minutes. In another example, the surface 116 of the component 22 may be cleaned by (i) immersing the surface 116 in a solution comprising nitric acid, (ii) rinsing the surface 116 in de-ionized water, (iii) immersing the surface 116 in a solution comprising sodium hydroxide, (iv) rinsing the surface 116 in de-ionized water, (v) immersing the surface 116 in a solution comprising acetone, and (vi) immersing the surface 116 in a solution comprising isopropyl alcohol. Also, other cleaning methods such as ultrasonication can be used.

Figure 4:
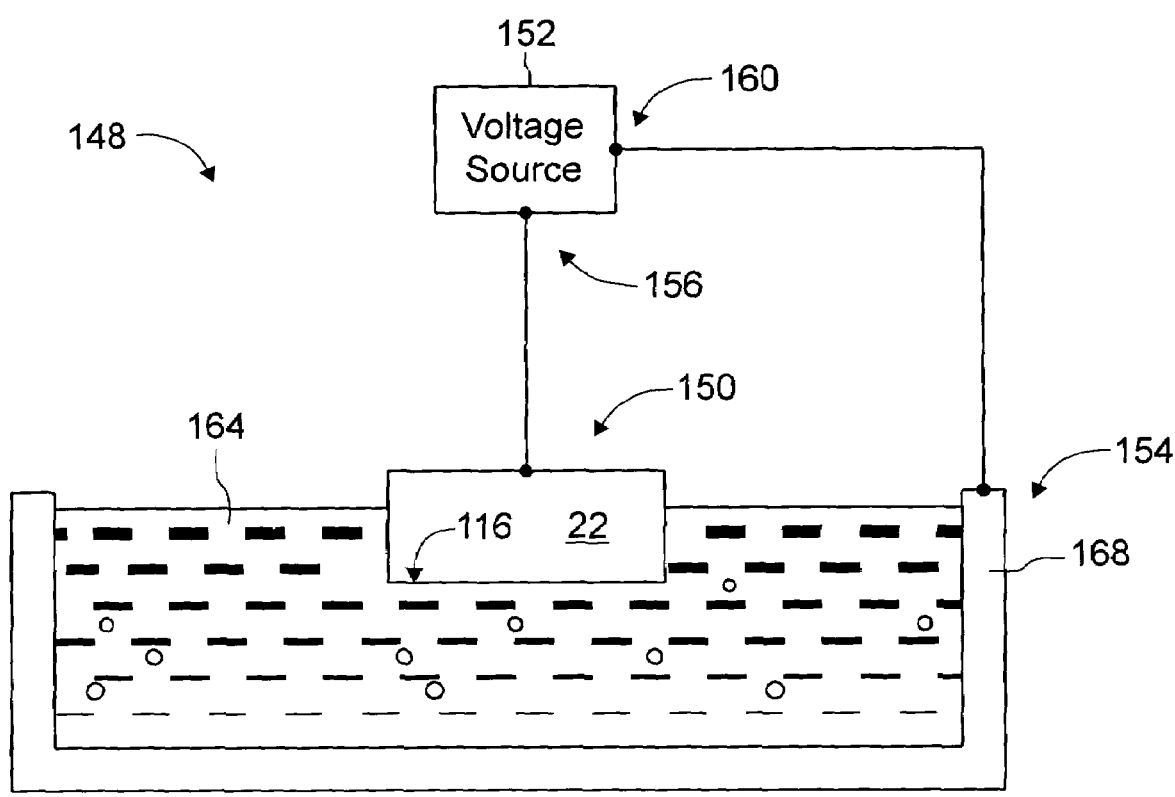
FIG. 4 is a partial sectional side view of a substrate processing chamber suitable for conducting steps of the method to fabricate the aluminum component having the coating.

After the surface 116 of the aluminum component 22 is treated, the surface 116 is anodized to create an anodized aluminum oxide layer 120 (step 302), as illustrated in FIG. 2B. In one version of the anodizing process, the component 22 serves as an anode 150 in an electrolytic cell 148, as shown for example in FIG. 4. Referring to FIG. 2B and FIG. 4, the electrolytic cell 148 comprises a tank 168 holding an anodizing solution 164, a voltage source 152, and the component 22. The component 22 is connected to a positive terminal 156 of the voltage source 152, and the tank 168 serves as the cathode 154, connected to a negative terminal 160 of the voltage source 152. The surface 116 of the component 22 is immersed in the anodizing solution 164 comprising, for example, an aqueous electrolyte having ions containing oxygen. Application of a bias voltage to the cathode 154 and anode 150 from the voltage source 152 builds up a positive charge on the surface 116 of the component 22, attracting negatively charged electrolyte species in the solution to the surface 116. The oxygen in the negatively charged species combines with the aluminum of the surface 116 of the component to form a first anodized aluminum oxide layer 120.

The anodizing conditions, such as the concentration and composition of the anodizing solution 164, the voltage and current supplied by the voltage source 152, and the temperature at which the process is conducted may be selected to provide an anodized aluminum oxide layer 120 having desired thickness and structural properties. A suitable anodizing solution 164 can comprise, for example, sulfuric acid, chromic acid, oxalic acid, phosphoric acid, water or mixtures thereof. Other suitable anodizing conditions, such as different anodizing solution compositions and other electrolytes can also be used. For example, in one version, the aluminum component 22 is anodized in an anodizing solution 164 comprising 15% by weight of sulfuric acid, 1% by weight of chromic acid, and water. The aluminum component 22 is anodized for about 1 minute to about 30 minutes at a temperature of about 15° C. to about 40° C. The voltage applied between the cathode 154 and anode 150 is about 10 V to about 100 V, and the current is limited to about 0.5 amps to about 5 amps.

The surface 124 of the anodized aluminum oxide layer 120 generally has surface features 128 such as imperfections, cracks, fissures, pores, and other deviations from planarity. These surface features 128 are commonly found on surfaces of anodized aluminum oxide layers. The surface features 128 are both inherent to layers created by the anodizing process and are also caused by other sources such as impurities in the underlying aluminum component 22 and on its surface 116. Aspects of the surface features 128 are undesirable, however, in regards to the protection that the anodized aluminum oxide layer 120 is capable of providing to the underlying aluminum component 22. For example, surface features 128 that extend into the anodized aluminum oxide layer 120 allow eroding agents, such as gases and plasmas present in the process chamber 20 during processing of substrates 26, access to the interior of the aluminum oxide layer 120, thus reducing the thickness of the layer 120 that is protecting the underlying aluminum component 22.

To reduce or eliminate the undesirable effect of the surface features 128, another aluminum oxide layer 132 is formed on the anodized aluminum oxide layer 120 (step 304) using a physical vapor deposition (PVD) or sputtering process. The sputtered aluminum oxide layer 132 fills up and removes the surface features 128, as illustrated in FIG. 2C, to form a sealant layer on the exposed surface of the component.

Figure 5:
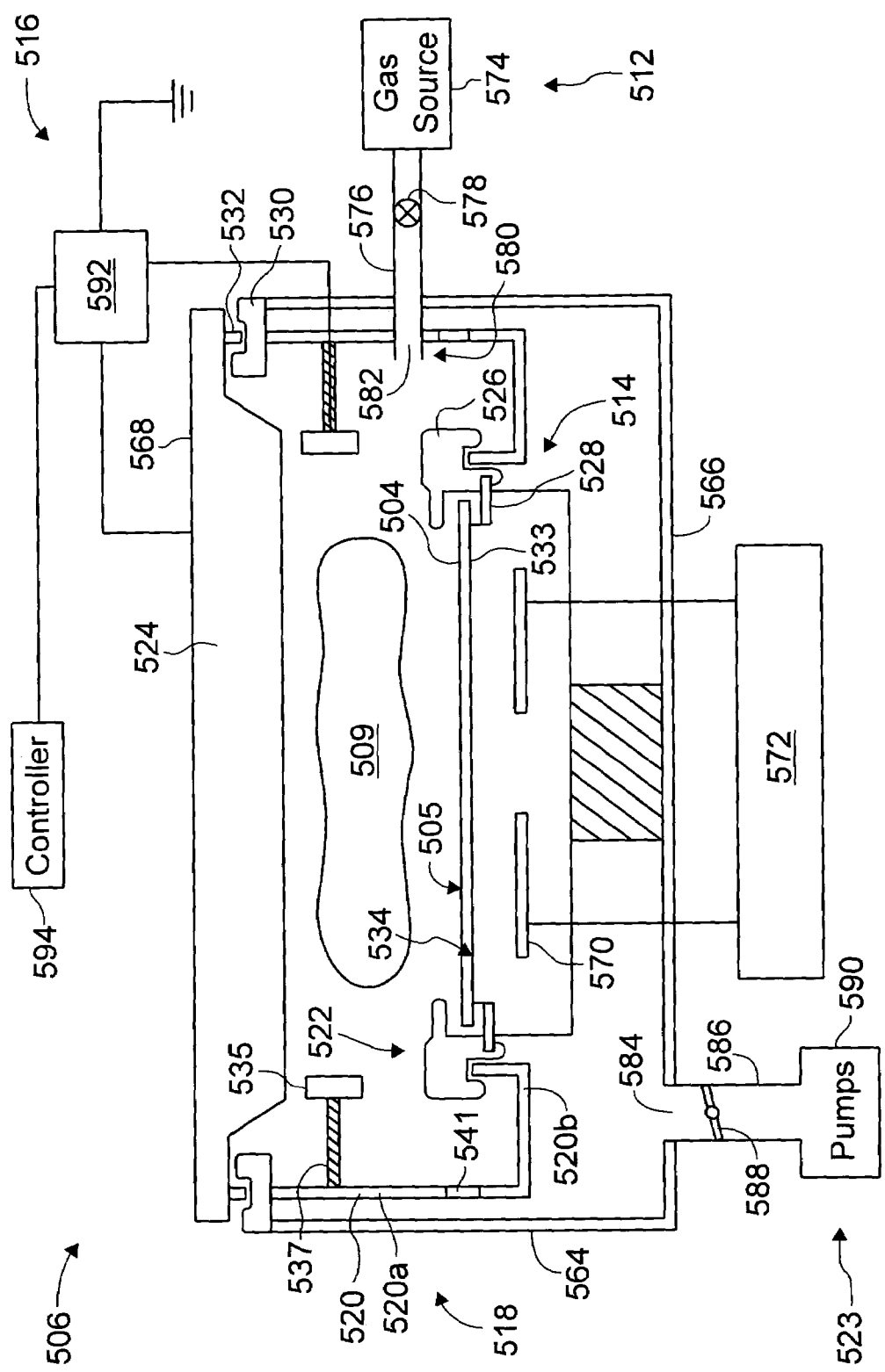
FIG. 5 is an exemplary physical vapor deposition process chamber suitable for depositing the second aluminum oxide layer.

An exemplary process chamber suitable for depositing the second aluminum oxide layer 132 is illustrated in FIG. 5. The process chamber 506 comprises a sputter deposition chamber, also called a physical vapor deposition or PVD chamber, which is capable of sputter depositing material, such as one or more of tantalum, tantalum nitride, titanium, titanium nitride, copper, tungsten, tungsten nitride and aluminum, on a substrate 504. Here, the substrate 504 is the aluminum component 22 with the anodized aluminum oxide layer 120. The chamber 506 comprises enclosure walls 518 that enclose a process zone 509, and that include sidewalls 564, a bottom wall 566, and a ceiling 568. Other chamber walls can include one or more shields 520 that shield the enclosure walls 518 from the sputtering environment.

The chamber 506 comprises a substrate support 514 to support the substrate 504 in the sputter deposition chamber 506. The substrate support 514 may be electrically floating or may comprise an electrode 570 that is biased by a power supply 572, such as an RF power supply. The substrate support 514 can also comprise a moveable shutter disk 533 that can protect the upper surface 534 of the support 514 when the substrate 504 is not present. In operation, the substrate 504 is introduced into the chamber 106 through a substrate loading inlet (not shown) in a sidewall 564 of the chamber 506 and placed on the support 514. The support 514 can be lifted or lowered by support lift bellows and a lift finger assembly (not shown) can be used to lift and lower the substrate 504 onto the support 514 during transport of the substrate 504 into and out of the chamber 506.

A process gas, such as a sputtering gas, is introduced into the chamber 506 through a gas delivery system 512 that includes a process gas supply comprising one or more gas sources 574 that each feed a conduit 576 having a gas flow control valve 578, such as a mass flow controller, to pass a set flow rate of the gas through. The conduits 576 can feed the gases to a mixing manifold (not shown) in which the gases are mixed to from a desired process gas composition. The mixing manifold feeds a gas distributor 580 having one or more gas outlets 582 in the chamber 506.

The process gas may comprise a non-reactive gas, such as argon or xenon, which is capable of energetically impinging upon and sputtering material from a target. The process gas may also comprise a reactive gas, such as one or more of an oxygen-containing gas and a nitrogen-containing gas, that are capable of reacting with the sputtered material to form a layer, such as aluminum oxide, on the substrate 504. Spent process gas and byproducts are exhausted from the chamber 506 through an exhaust 523 which includes one or more exhaust ports 584 that receive spent process gas and pass the spent gas to an exhaust conduit 586 in which there is a throttle valve 588 to control the pressure of the gas in the chamber 506. The exhaust conduit 586 feeds one or more exhaust pumps 590. Typically, the pressure of the sputtering gas in the chamber 506 is set to sub-atmospheric levels.

The sputtering chamber 506 further comprises a sputtering target 524 facing a surface 505 of the substrate 504, and comprising material to be sputtered onto the substrate 504, such as aluminum. The target 524 is electrically isolated from the chamber 506 by an annular insulator ring 532, and is connected to a power supply 592. The sputtering chamber 506 also has a shield 520 to protect a wall 518 of the chamber 506 from sputtered material. In one version, one or more of the power supply 592, target 524, and shield 520, operate as a gas energizer 516 that is capable of energizing the sputtering gas to sputter material from the target 524. The power supply 592 applies a bias voltage to the target 524 with respect to the shield 520. The electric field generated in the chamber 506 from the applied voltage energizes the sputtering gas to form a plasma that energetically impinges upon and bombards the target 524 to sputter material off the target 524 and onto the substrate 504. The support 514 having the electrode 570 and support electrode power supply 572 may also operate as part of the gas energizer 516 by energizing and accelerating ionized material sputtered from the target 524 towards the substrate 504. Furthermore, a gas energizing coil 535 can be provided that is powered by a power supply 592 and that is positioned within the chamber 506 to provide enhanced energized gas characteristics, such as improved energized gas density. The gas energizing coil 535 can be supported by a coil support 537 that is attached to a shield 520 or other wall in the chamber 506.

The chamber 506 can be controlled by a controller 594 that comprises program code having instruction sets to operate components of the chamber 506 to process substrates 504 in the chamber 506. For example, the controller 594 can comprise a substrate positioning instruction set to operate one or more of the substrate support 514 and substrate transport to position a substrate 504 in the chamber 506; a gas flow control instruction set to operate the flow control valves 578 to set a flow of sputtering gas to the chamber 506; a gas pressure control instruction set to operate the exhaust throttle valve 588 to maintain a pressure in the chamber 506; a gas energizer control instruction set to operate the gas energizer 516 to set a gas energizing power level; and a process monitoring instruction set to monitor the process in the chamber 506.

In one version, the sputtering chamber 506 is used to form the sputtered aluminum oxide layer 132 by introducing a sputtering gas comprising a non-reactive gas, e.g., argon, and an oxygen-containing gas, and applying a voltage to an aluminum target 524. During deposition, aluminum ions from the target 524 react with the oxygen-containing gas to form the aluminum oxide layer 132 on the substrate 504.

The thickness of the anodized 120 and sputtered aluminum oxide layers 132 are selected to maximize the effectiveness of the protective coating while minimizing undesirable aspects, such as the length and cost of processing the coating, and the tendency for excessively thick coatings to delaminate from the underlying aluminum component 22. In one version, where the underlying aluminum component comprises a standard 6061 aluminum alloy, the thickness of the anodized aluminum oxide layer 120 is from about 15 to about 35 µm, for example about 25 µm (approximately 1 mil) and the thickness of the sputtered aluminum oxide layer 132 is from about 2 µm to about 5 µm. In another version, where the underlying aluminum component comprises LP™ aluminum alloy, the thickness of the anodized aluminum oxide layer 120 is the same, but the thickness of the sputtered aluminum oxide layer 132 is lower at from about 1 µm to about 2 µm.

In the method to form the aluminum oxide layer 132, the PVD or sputtering process is preferable in comparison to other processes to deposit the aluminum oxide layer, such as for example, chemical vapor deposition (CVD) and plasma spraying processes. It has been observed that the sputtered aluminum oxide layer 132 is preferable to a CVD aluminum oxide layer because the PVD process deposits a dense conformal aluminum oxide layer 132 with very low porosity, whereas the CVD process deposits an aluminum oxide layer that has high porosity and therefore poor corrosion-resistance properties.

The sputtered aluminum oxide layer 132, characterized by its high density and low porosity, effectively protects the underlying anodized aluminum oxide layer 120 and aluminum component 22 beneath from the corrosive gases and also prevents impurities in the aluminum component 22 from diffusing out of the aluminum component 22 and into the chamber 20. Accordingly, the two layer protective coat makes the component 20 less susceptible to the corrosive gases, thereby improving the component's durability and lifetime, and prevents impurities from escaping from the component 20, thereby substantially reducing contamination in the chamber 20

Although exemplary embodiments of the present invention are shown and described, those of ordinary skill in the art may devise other embodiments which incorporate the present invention, and which are also within the scope of the present invention. For example, the underlying structure may form portions of chamber components 22 other than those specifically mentioned, as would be apparent to those of ordinary skill in the art. Furthermore, the terms below, above, bottom, top, up, down, first and second and other relative or positional terms are shown with respect to the exemplary embodiments in the figures and are interchangeable. Therefore, the appended claims should not be limited to the descriptions of the preferred versions, materials, or spatial arrangements described herein to illustrate the invention.

What is claimed is:

1. A method of manufacturing a corrosion-resistant aluminum chamber component having a surface, the method comprising:
   (a) providing an aluminum chamber component comprising at least a portion of an enclosure wall, liner, substrate support, gas supply, gas energizer, gas exhaust, or substrate transport of a processing chamber;
   (b) roughening a surface of the aluminum chamber component by bead blasting the surface to a roughness of about 100 to about 200 µm;

(c) anodizing the surface of the aluminum chamber component to form an anodized aluminum oxide layer; and (d) sputter coating a sputtered aluminum oxide layer consisting of aluminum oxide in a thickness of from about 2 to about 5 µm, on the anodized aluminum oxide layer, whereby the anodized aluminum oxide layer and the sputtered aluminum oxide layer are capable of protecting the aluminum chamber component from corrosive gases.

2. A method according to claim 1 wherein (d) comprises:
(i) placing the anodized surface of the aluminum chamber component in a process zone facing a target comprising aluminum;
(ii) introducing a sputtering gas comprising argon and an oxygen-containing gas to the process zone;
(iii) applying a voltage to an aluminum target; and
(iv) exhausting the sputtering gas from the process zone.

3. A method according to claim 1 wherein the anodized aluminum layer comprises a thickness of from about 15 to about 35 µm.

4. A method according to claim 3 wherein the aluminum chamber component comprises an aluminum-magnesium-silicon alloy.

5. A method according to claim 3 wherein the aluminum chamber component comprises an aluminum alloy having concentrations of mobile and non-mobile impurities controlled to be within specific ranges.

6. A method according to claim 5 wherein the aluminum alloy comprises a material having a magnesium concentration of from about 3.5% to about 4.0% by weight, a silicon concentration of less than 0.03% by weight, an iron concentration of less than 0.03% by weight, a copper concentration of from about 0.02% to about 0.07% by weight, a manganese concentration of from about 0.005% to about 0.015% by weight, a zinc concentration of from about 0.08% to about 0.16% by weight, a chromium concentration of from about 0.02% to about 0.07% by weight, and a titanium concentration of less than 0.01% by weight.

7. A method according to claim 6 wherein other impurities in the aluminum alloy each do not exceed about 0.03% by weight, and total other impurities do not exceed about 0.1% by weight.

8. A method according to claim 7 wherein the aluminum alloy material comprises impurity particles, at least 95% of the impurity particles having a size of less than 5 µm, no more than 5% of the impurity particles having a size in the range of from 5 µm to 20 µm, no more than 0.1% of the particles having a size larger than 20 µm, and no impurity particles having a size larger than 40 µm.

9. A method according to claim 1 wherein step (b) further comprises cleaning the surface of the aluminum chamber component by dipping the surface of the aluminum chamber component into an organic solvent, an alkaline solution, an acidic solution, water, de-ionized water, or mixtures thereof.

10. A method according to claim 1 wherein roughening the surface of the aluminum chamber component is followed by a step of cleaning the surface.

11. A method according to claim 1 wherein step (c) further comprises anodizing the surface of the aluminum chamber component by:
(i) dipping the surface of the aluminum chamber component in an anodizing acidic solution comprising one or more of sulfuric acid, chromic acid, oxalic acid, phosphoric acid, water or mixtures thereof; and
(ii) applying a voltage to the aluminum chamber component.

12. A method of manufacturing a corrosion-resistant aluminum component having a surface, the method comprising:
(a) providing an aluminum chamber component comprising at least a portion of an enclosure wall, liner, substrate support, gas supply, gas energizer, gas exhaust, or substrate transport of a processing chamber:
(b) roughening a surface of the aluminum chamber component by bead blasting the surface to a roughness of about 100 to about 200 µm;
(c) anodizing the surface of the aluminum chamber component to form an anodized aluminum oxide layer comprising surface features, the anodized layer having a thickness of about 15 to about 35 µm; and
(d) filling up the surface features by sputter coating a sputtered aluminum oxide layer consisting of aluminum oxide in a thickness of from about 2 to about 5 µm, on the anodized aluminum oxide layer, by:
(i) placing the anodized surface of the aluminum chamber component in a process zone facing a target comprising aluminum;
(ii) introducing a sputtering gas comprising argon and an oxygen-containing gas to the process zone;
(iii) applying a voltage to an aluminum target; and
(iv) exhausting the sputtering gas from the process zone, whereby the anodized aluminum oxide layer and the aluminum oxide sputtered layer are capable of protecting the aluminum chamber component from corrosive gas.

13. A method according to claim 12 wherein the aluminum chamber component comprises an aluminum-magnesium-silicon alloy.

14. A method according to claim 12 wherein the aluminum chamber component comprises an aluminum alloy having concentrations of mobile and non-mobile impurities controlled within specific ranges.

15. A method according to claim 12 wherein the surface features comprise one or more of imperfections, cracks, fissures and pores.

16. A corrosion-resistant aluminum chamber component for a substrate processing chamber, the component comprising:
(a) an aluminum chamber component body having a bead blasted roughened surface, the roughened surface having a surface roughness of about 100 to about 200 µm;
(b) an anodized aluminum oxide layer comprising a thickness of from about 15 to about 35 µm formed on the roughened surface of the aluminum chamber component body; and
(c) a sputtered aluminum oxide layer consisting of aluminum oxide and comprising a thickness of from about 2 to about 5 µm on the anodized aluminum oxide layer.

17. An aluminum chamber component according to claim 16 wherein the aluminum body comprises an aluminum-magnesium-silicon alloy.

18. An aluminum chamber component according to claim 16 wherein the aluminum chamber component body comprises an aluminum alloy having concentrations of mobile and non-mobile impurities controlled to be within specific ranges.

19. An aluminum component according to claim 16 wherein the aluminum chamber component body comprises at least a portion of an enclosure wall, liner, substrate support, gas supply, gas energizer, gas exhaust, or substrate transport of a processing chamber.

20. A method of providing a corrosion-resistant coating on a surface of a substrate processing chamber wall, the method comprising:

(a) providing a substrate processing chamber wall comprising aluminum and having inner and outer surfaces;

(b) roughening the inner surface of the chamber wall by bead blasting the surface to a roughness of about 100 to about 200 μm;

(c) anodizing the inner surface of the chamber wall to form an anodized aluminum oxide layer having surface features; and (d) filling up the surface features by sputter coating a sputtered aluminum oxide layer, on the anodized aluminum oxide layer, the sputtered aluminum oxide layer consisting of aluminum oxide deposited to a thickness of from about 2 to about 5 μm, whereby the anodized aluminum oxide layer and the sputtered aluminum oxide layer are capable of protecting the chamber wall from corrosive gases.

21. A method according to claim 20 wherein the chamber wall is a liner or shield.

22. A corrosion-resistant substrate processing chamber component comprising:

(a) a substrate processing chamber wall comprising aluminum and having inner and outer surfaces, the inner surface comprising a bead blasted roughened surface the bead blasted surface roughened to a roughness of about 100 to about 200 μm;

(b) an anodized aluminum oxide layer formed on the roughened surface of the inner surface of the wall, the aluminum oxide layer having a thickness of from about 15 to about 35 μm; and (c) a sputtered aluminum oxide layer consisting of aluminum oxide on the anodized aluminum oxide layer, the sputtered aluminum oxide layer having a thickness of from about 1 to about 5 μm.

23. An aluminum chamber according to claim 22 wherein the wall is a liner or shield.

24. A method of manufacturing a corrosion-resistant aluminum component having a surface, the method comprising:

(a) forming an aluminum chamber component comprising at least a portion of an enclosure wall, liner, substrate support, gas supply, gas energizer, gas exhaust, or substrate transport of a processing chamber:

(b) bead blasting a surface of the aluminum chamber component to a roughness average of from about 100 to about 200 microinches;

(c) cleaning the bead blasted surface of the aluminum chamber component;

(d) anodizing the bead blasted surface of the cleaned aluminum chamber component to form an anodized aluminum oxide layer having a thickness of from about 15 to about 35 μm, wherein anodizing the bead blasted surface comprises:

(i) exposing the bead blasted surface of the aluminum chamber component to an anodizing acidic solution comprising one or more of sulfuric acid, chromic acid, oxalic acid, phosphoric acid, water or mixtures thereof; and (ii) applying a voltage to the aluminum chamber component while exposed to the anodizing acidic solution; and (e) filling surface features of the anodized aluminum oxide layer by sputter coating a sputtered aluminum oxide layer consisting of aluminum oxide in a thickness of from about 2 to about 5 μm by:

(i) placing the anodized aluminum oxide layer deposited over the bead blasted surface in a process zone facing a target comprising aluminum;

(ii) introducing a sputtering gas comprising argon and an oxygen-containing gas to the process zone;

(iii) applying a voltage to an aluminum target; and (iv) exhausting the sputtering gas from the process zone.

* * * * *